United States Patent
Somayaji et al.

(10) Patent No.: US 7,043,705 B2
(45) Date of Patent: May 9, 2006

(54) ESTIMATING CURRENT DENSITY PARAMETERS ON SIGNAL LEADS OF AN INTEGRATED CIRCUIT

(75) Inventors: Ananth G Somayaji, Bangalore (IN); Sugandhini Karunanidhi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 370 days.

(21) Appl. No.: 10/614,132

(22) Filed: Jul. 8, 2003

(65) Prior Publication Data

US 2005/0010881 A1  Jan. 13, 2005

(51) Int. Cl.
  *G06F 17/50* (2006.01)
  *G06F 9/45* (2006.01)
  *G06G 7/62* (2006.01)
(52) U.S. Cl. .................................. 716/5; 703/13
(58) Field of Classification Search .................. None
  See application file for complete search history.

(56) References Cited

U.S. PATENT DOCUMENTS

| | | | | |
|---|---|---|---|---|
| 5,629,621 A * | 5/1997 | Goldfine et al. | ............ | 324/239 |
| 5,812,434 A * | 9/1998 | Nagase et al. | ............ | 703/2 |
| 6,038,383 A * | 3/2000 | Young et al. | ............ | 716/5 |
| 6,397,171 B1 * | 5/2002 | Belk | ............ | 703/14 |
| 6,513,001 B1 * | 1/2003 | Kapur et al. | ............ | 703/13 |
| 6,598,208 B1 * | 7/2003 | Sasaki et al. | ............ | 716/4 |
| 6,742,167 B1 * | 5/2004 | Grau | ............ | 716/4 |
| 6,766,498 B1 * | 7/2004 | Sharma et al. | ............ | 716/5 |
| 6,775,807 B1 * | 8/2004 | Lowther et al. | ............ | 716/1 |
| 6,826,517 B1 * | 11/2004 | Okada | ............ | 703/2 |
| 6,857,113 B1 * | 2/2005 | Gentry et al. | ............ | 716/5 |
| 2004/0194043 A1 * | 9/2004 | Sundar et al. | ............ | 716/5 |

OTHER PUBLICATIONS

Nagaraj et al., "A Practical Approach to Static Signal Electromigration Analysis," 1998 ACM/DAC, pp. 572-577.*
Donohoe et al., "Simple Edge Basis Functions for Open-Ended Bodies of Revolution," 1995 IEEE, pp. 329-332.*
Ting et al., "AC Electromigration Characterization and Modeling of Multilayered Interconnects," 1993 IEEE/IRPS, pp. 311-316.*

* cited by examiner

*Primary Examiner*—Leigh M. Garbowski
(74) *Attorney, Agent, or Firm*—Alan K. Stewart; W. James Brady, III; Frederick J. Telecky, Jr.

(57) ABSTRACT

Estimating current density parameters on signal leads of an integrated circuit using computer aided design (CAD) tools. The signal leads are modeled as an impedance network (e.g., containing resistors and capacitors) and the driver cells are modeled as triangle (current) signal. The parameters of the triangle signal (e.g. peaks, periodicity) may be determined based on the characterization data of corresponding driver cell. By measuring the signals transferred on the impedances, the current density parameters on signal leads may be estimated.

6 Claims, 5 Drawing Sheets

ESTIMATING CURRENT DENSITY PARAMETERS ON SIGNAL LEADS OF AN INTEGRATED CIRCUIT

BACKGROUND OF THE INVENTION

1. Field of the Invention

The present invention relates to computer aided design (CAD) used to design integrated circuits, and more specifically to a method and apparatus for measuring current density parameters on signal leads of an integrated circuit.

2. Related Art

Integrated circuits generally contain several components such as flip-flops, logic gates, multiplexors, and comparators. Components in an integrated circuit are interconnected using medium such as metal wires, which are generally referred to as signal leads. Thus, a signal lead is typically designed to carry/transfer a signal from a component (hereafter 'driver cell') to another component (hereafter 'load cell'). The signal, when transferred, is characterized by several parameters ('current density parameters') such as average value, RMS (root-mean-square) current densities etc.

It is often desirable to estimate the current density parameters on signal leads during the design of an integrated circuit. For example, the estimated values can be used to ensure that the current density parameters do not exceed corresponding pre-defined threshold values when the circuit is used later after fabrication. Such operation generally leads to reliable operation of integrated circuits in their intended lifetime, as is well known in the relevant arts.

Current density parameters are typically estimated in a design phase by performing a simulation (e.g., using SPICE program, well known in the relevant arts) based on a digital representation of the integrated circuit. In one prior approach, the simulated components include all the lower level components (transistors, etc.) of driver cell(s) and load cells along with the connected signal leads.

One advantage of such an approach is that the estimated values (for the current density parameters) closely represent the parameters that would be encountered when the integrated circuit is operational. However, one problem with the approach is that a substantial amount of computational resources (e.g., processor time, memory) may be required to determine the parameters of a signal on the signal lead. In addition, such an approach may require a substantial number of data inputs, which may not be always available. Accordingly, the corresponding solutions may be unacceptable at least in some environments.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An aspect of the present invention takes advantage of the property of driver cells which generates triangular signals as inputs to the signal leads connecting to load cells during normal operation after fabrication. Thus, in an embodiment, simulation is performed by modeling the signal leads in the form of an impedance network (e.g., resistors and capacitors) and providing the input signals (to the signal leads) in the form of a triangle signal. The signals levels on the impedance network are then measured to estimate the current density parameters on the signal leads when the corresponding integrated circuit would be deployed. The aggregate resources and/or time required to measure current density parameters on signal leads of integrated circuits may be reduced as a result, as described below.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Computer System

Figure 1:
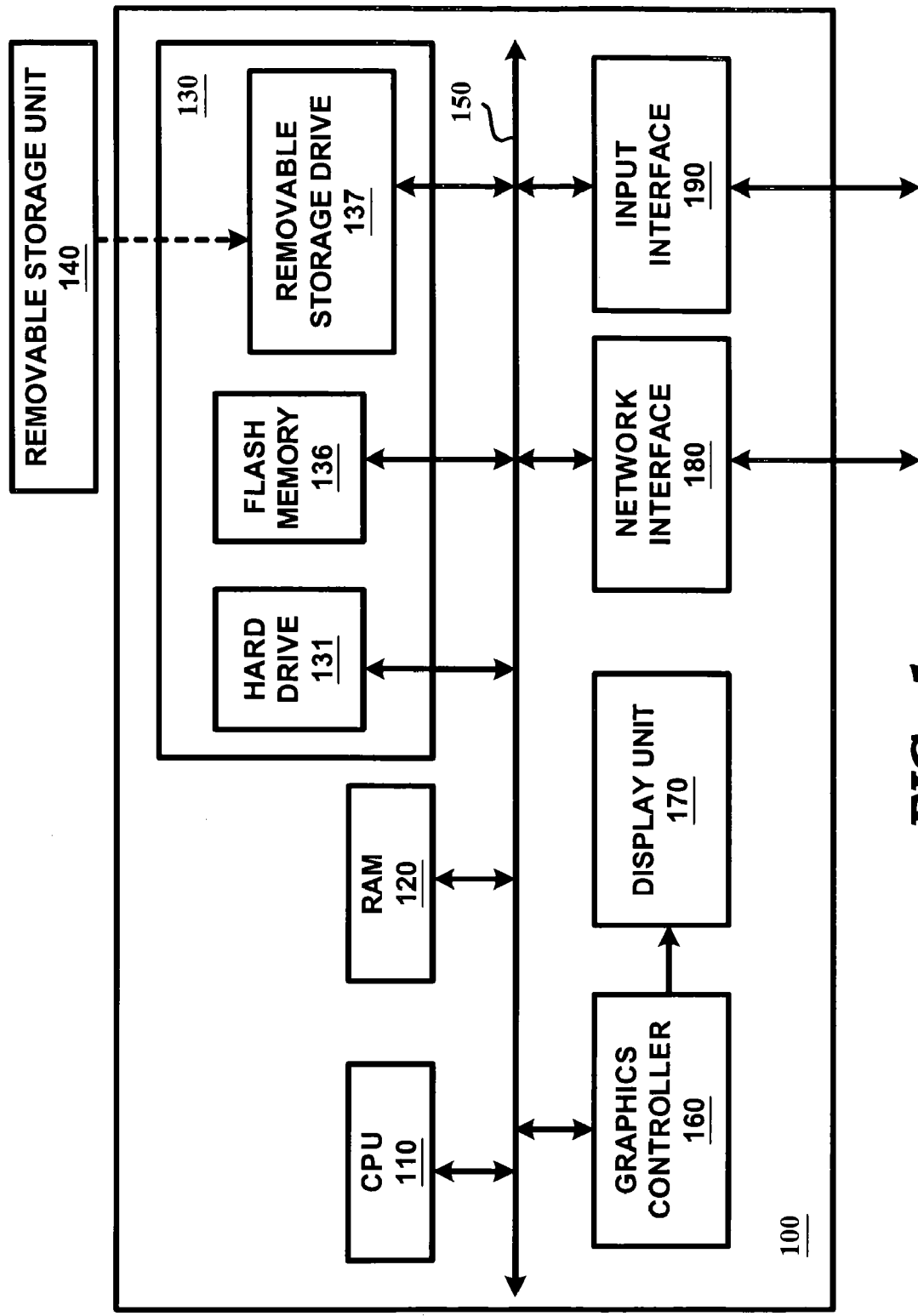
FIG. 1 is a block diagram of a computer system implemented according to an aspect of present invention.

FIG. 1 is a block diagram of computer system 100 illustrating an example system for implementing the present invention. Computer system 100 may contain one or more processors such as central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described below in further detail.

CPU 110 may execute instructions stored in RAM 120 to provide several features of the present invention. CPU 110 may contain multiple processing units, with each processing unit potentially being designed for a specific task. Alternatively, CPU 110 may contain only a single processing unit. RAM 120 may receive instructions from secondary memory 130 using communication path 150. Data representing various cells (in libraries) and the determined current density parameters corresponding to each signal lead may be stored in and retrieved from secondary memory 130 (and/or RAM 120) during the execution of the instructions.

Graphics controller 160 generates display signals (e.g., in RGB format) to display unit 170 based on data/instructions received from CPU 110. Display unit 170 contains a display screen to display the images defined by the display signals. Input interface 190 may correspond to a key-board and/or mouse, and generally enables a user to provide inputs. Network interface 180 enables some of the inputs (and outputs) to be provided on a network. In general, display unit 170, input interface 190 and network interface 180 enable a user to design integrated circuits using cell libraries provided in secondary memory 130 (or received from network interface 180), and may be implemented in a known way.

Secondary memory 130 may contain hard drive 131, flash memory 136 and removable storage drive 137. Secondary storage 130 may store the software instructions and data (e.g., cell libraries and determined current density parameters corresponding to each signal lead), which enable computer system 100 to provide several features in accordance with the present invention. Some or all of the data and instructions may be provided on removable storage unit 140, and the data and instructions may be read and provided by removable storage drive 137 to CPU 110. Floppy drive, magnetic tape drive, CD-ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer readable storage medium having stored therein computer software and/or data. An embodiment of the present invention is implemented using software running (that is, executing) in computer system 100.

In this document, the term "computer program product" is used to generally refer to removable storage unit 140 or hard disk installed in hard drive 131. These computer program products are means for providing software to computer system 100. As noted above, CPU may retrieve the software instructions, and execute the instructions to provide various features of the present invention. The features of the present invention are described below in detail. For illustration, the features are described with reference to an example integrated circuit.

3. Example Component

Figure 2:
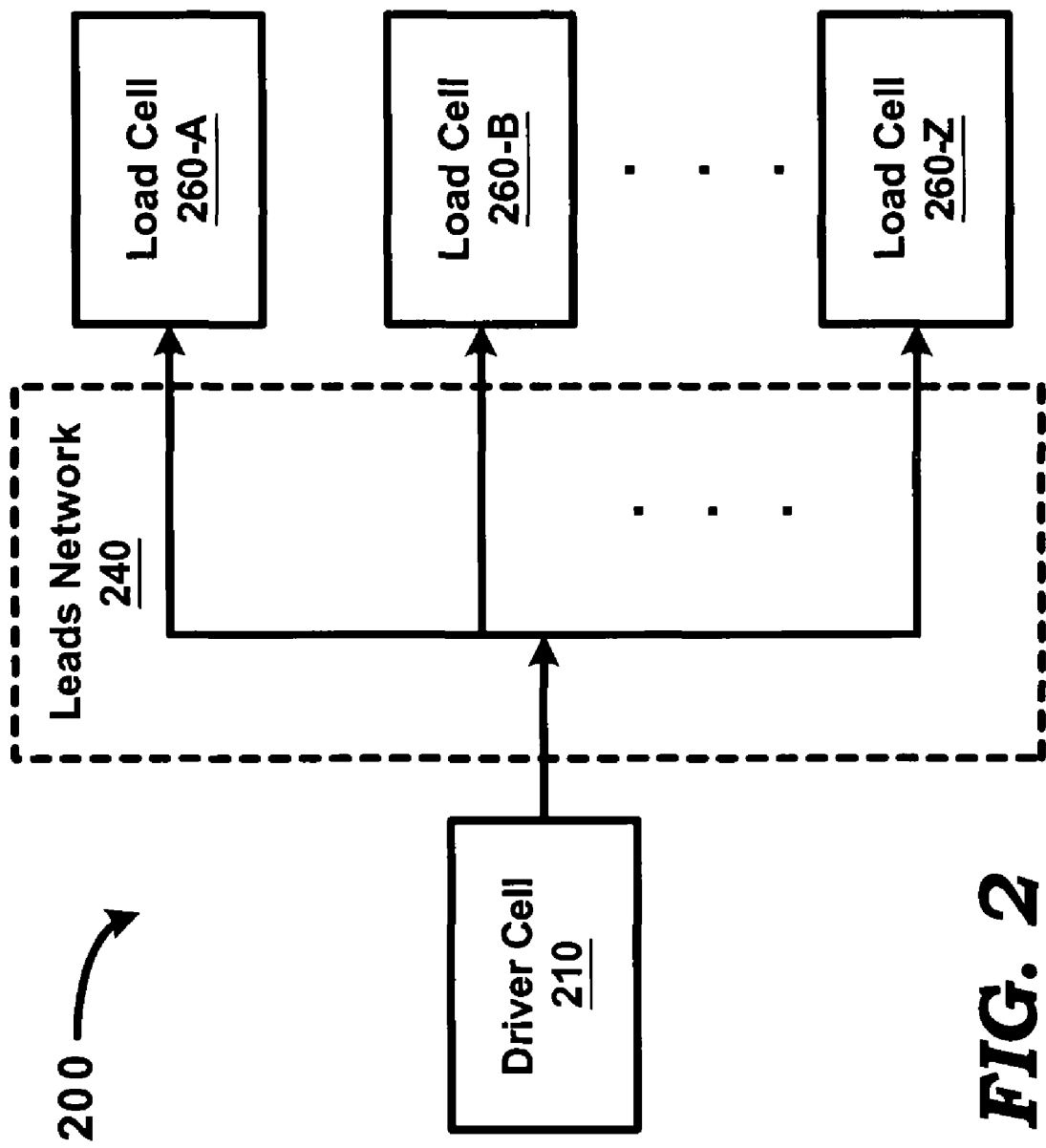
FIG. 2 is a block diagram of example integrated circuit, the current density parameters on signal leads of which can be measured according to an aspect of the present invention.

FIG. 2 is a block diagram of example integrated circuit 200, the current density parameters on signal leads of which can be measured according to an aspect of the present invention. Integrated circuit 200 is shown containing driver cell 210, leads network 240 and load cells 260-A to 260-Z.

Merely for simplicity, the diagram is shown containing a few representative components connected with a simple topology. However, typical environments using various aspects of the present invention contain several more components connected using complex topologies. Each block is described below in further detail.

Driver cell 210 represents a functional block (e.g, flip-flop) which generates a signal to be transferred to another cell. The signal can be transferred to several cells using corresponding leads as shown in FIG. 2. The leads together are shown contained in leads network 240.

Load cells 260-A to 260-Z represent functional blocks (e.g., comparators) which perform corresponding tasks based on the signal received from driver cell 210. Each load cell is shown receiving the corresponding signal on a corresponding signal lead of the leads network 240.

The manner in which the current density parameters on signal leads of lead network 240 can be determined is described below. However, the approaches can be applied to other environments as will be apparent to one skilled in the relevant arts. Such applications are contemplated to be within the scope and spirit of various aspects of the present invention.

4. Principle

Figure 3:
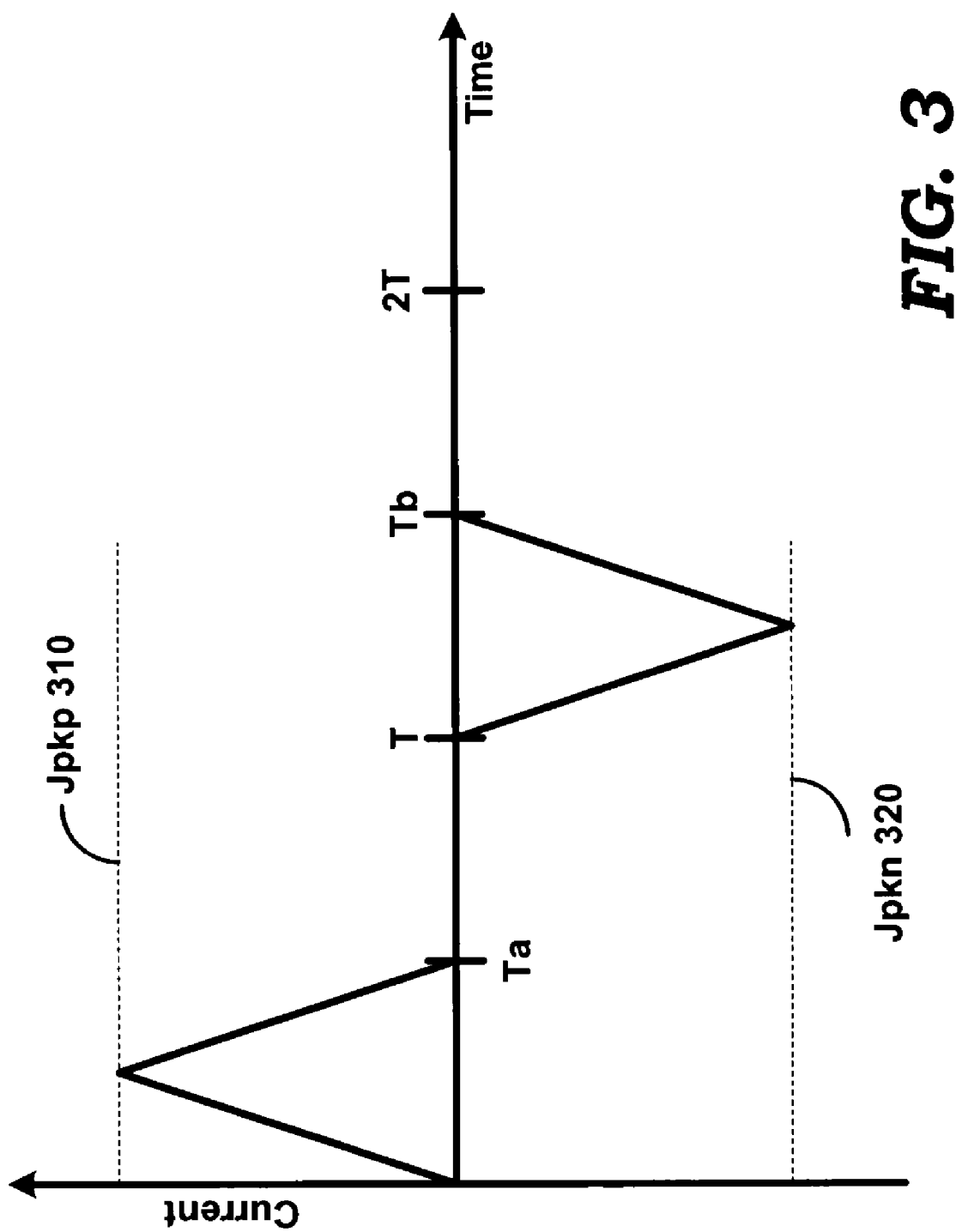
FIG. 3 is a waveform illustrating an input signal, which can be used to determine the current density parameters on each of the leads according to an aspect of present invention.

FIG. 3 is a waveform illustrating an input signal, which can be used to determine the current density parameters on each of the leads according to an aspect of present invention. The waveform is depicted with reference to time along x-axis and current along y-axis.

The input signal of FIG. 3 is designed based on an observation that a steep increase of current signal through a load cell (modeled as a capacitor) would be encountered while the load cell is accumulating electric charges (charging), and a similar decrease would be encountered while discharging. The result of electric current waveform through the load cell due to charging and discharging may be approximated by a triangle signal. Thus, an input signal modeled as a triangle signal may be used to perform simulation which may enables accurate estimation of the current density parameters on a signal leads.

However, to generate the input signal of FIG. 3, various parameters may be required. As described in sections below, positive peak (Jpkp) 310 and negative peak (Jpkn) 320 may be received from characterization of the driver cells. The periodicity (T) of the entire signal may be determined by the expected frequency of operation of the integrated circuit. The duration of the positive and negative pulses Ta and Tb may also be required, and may be generated as described below from RMS current (Jrms) and average current (Javg), which may also be available from simulation of the driver cells.

As is well known, with respect to the waveform of FIG. 3:

$$Jrms^2 = [\{Jpkp^2 Ta\}/3T + \{Jpkn^2 Tb\}/3T]/2 \qquad \text{Equation (1)}$$

$$Javg = [\{Jpkp\ Ta\}/2T - \{r\ Jpkn\ Tb\}/2T]/2 \qquad \text{Equation (2)}$$

wherein r represents a recovery factor, the value of which generally depends on the specific fabrication technology. The recovery factor can be determined experimentally, for example, as described in further detail in an article entitled, "AC electro-migration characterization and modeling of multilayered interconnect" (by Ting L. M., May J. S., Hunter W. R., McPherson J. W.), Conference: International Reliability Physics Symposium, 1993. In an embodiment, the recovery factor is set equal to 0.5.

Solving for Ta and Tb:

$$Ta = [\{6T\ Jrms^2 + (8T\ Javg\ Jpkn)\}/\{Jpkp(Jpkp + 2Jpkn)\}] \qquad \text{Equation (3)}$$

$$Tb = [2\ \{6T\ Jrms^2 - (4\ T\ Javg\ Jpkp)\}/\{Jpkn(Jpkp + 2Jpkn)\}] \qquad \text{Equation (4)}$$

Thus, using the above equations, T, Jpkp and Jpkn, the triangle waveform of FIG. 3 can be constructed. The manner in which the above principle and input signal can be used to estimate current density parameters on signal leads is described below in further detail.

5. Method

Figure 4:
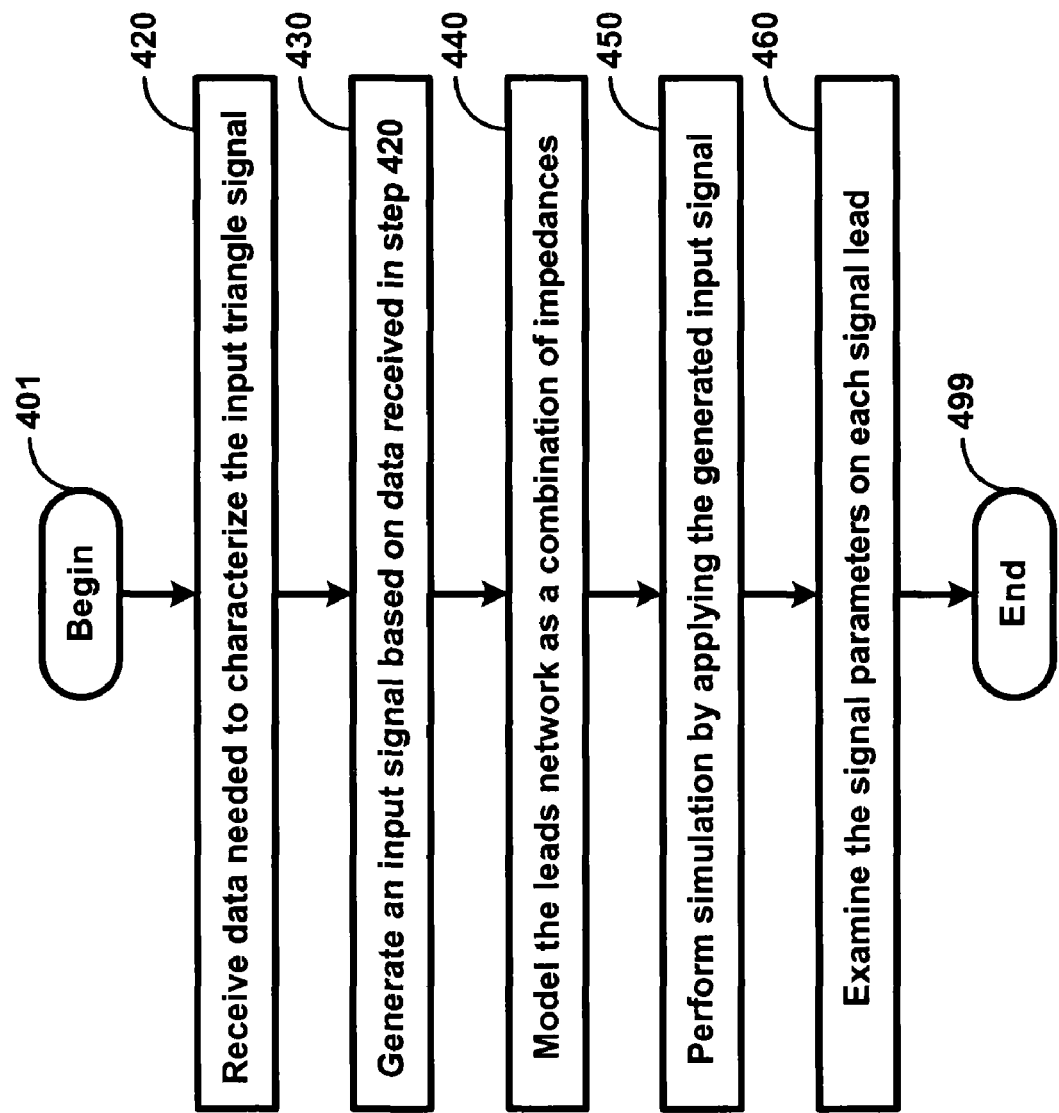
FIG. 4 is a flowchart illustrating the manner in which current density parameters of signal leads may be estimated quickly according to an aspect of present invention.

FIG. 4 is a flowchart illustrating the manner in which current density parameters of signal leads may be estimated quickly according to an aspect of present invention. The method begins in step 401 in which control immediately passes to step 420. The method is described with reference to FIG. 1 merely for illustration. The method can be implemented with other types of systems as well.

In step 420, computer system 100 receives data needed to characterize an input triangle signal, which can be used as an input to the signal leads. As may be appreciated, the specific shape of the triangle signal can be determined based on parameters such as positive peak, negative peak, average and root-mean square (RMS) values (of the current signal). Such values in turn may be determined by various characteristics of driver cells. In an embodiment, each set of such parameters are generated for a specific values of load and slew (rate at which clock/data signals transition) using CAD tools such as SPICE widely available in the market place.

In step 430, computer system 100 generates data (e.g., peaks, periodicity of the positive and negative portions) representing the input triangle signal based on data received in step 420. The periodicity of the signal may be determined by the frequency at which the integrated circuit needs to operate.

In step 440, computer system 100 models leads network 240 as an impedance network containing impedances connected according to a topology. In an embodiment, each signal lead is modeled as a RC network (containing resistor(s) and capacitor(s)). Such modeling can be performed in a known way using several commercially available CAD tools.

In step 450, computer system 100 performs simulation by applying the input signal generated in step 420 to the impedance network modeled in step 430 (along with load cells). In step 460, the signal levels on various impedances are examined to determine the current density parameters on each signal lead. The method ends in step 499.

In general, the steps of FIG. 4 may be integrated into various CAD tools. The determined parameters can be used to compare with any corresponding thresholds, and a report may be generated specifically indicating any violations (i.e., outside of permitted threshold limits). The description is continued with reference to the manner in which an integrated circuit is modeled in an embodiment of the present invention.

6. Modeled Integrated Circuit

Figure 5:
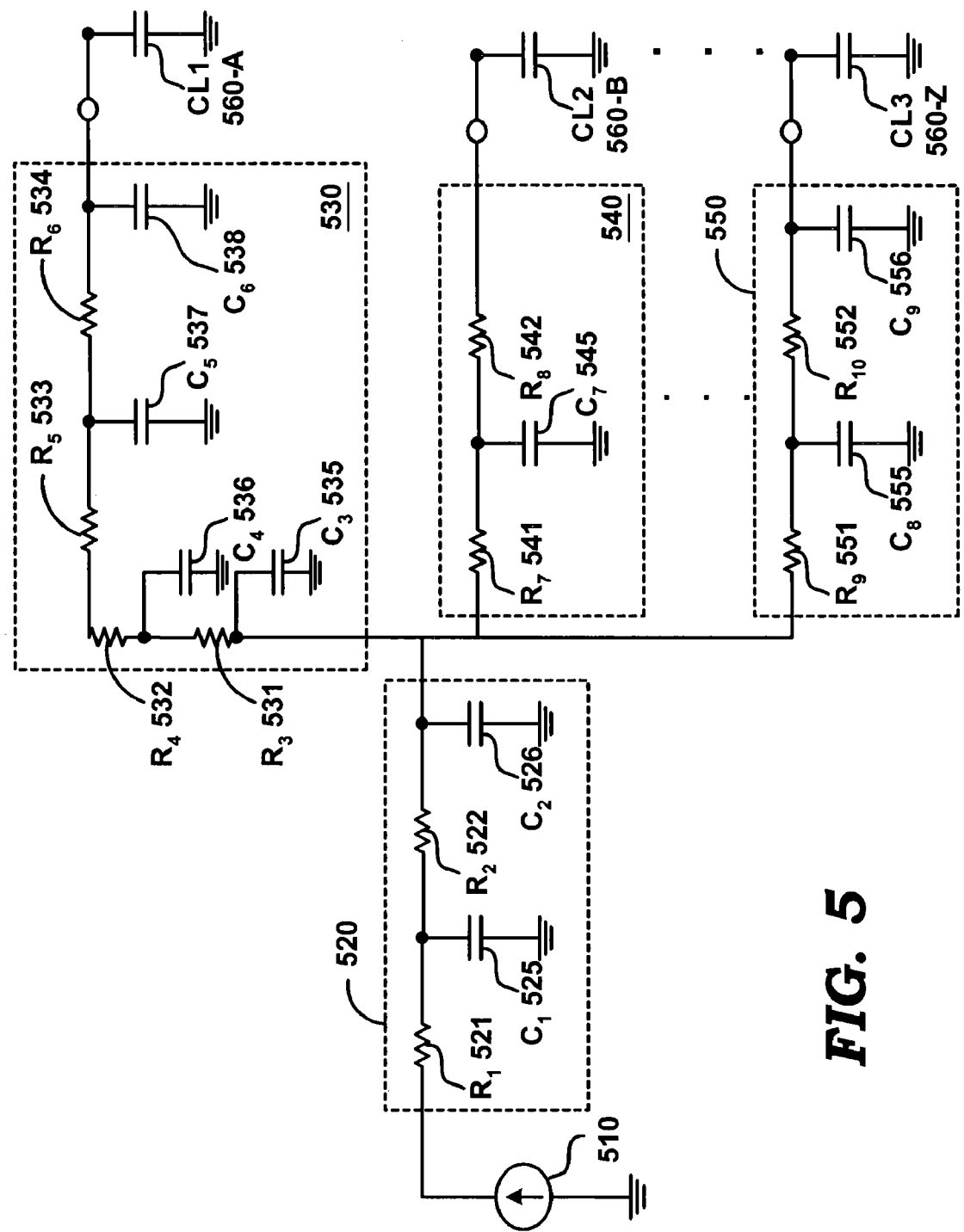
FIG. 5 is a circuit diagram illustrating the manner in which the integrated circuit can be modeled in one embodiment.

FIG. 5 is a circuit diagram illustrating the manner in which the integrated circuit of FIG. 2 can be modeled in one embodiment. Current source 510 generates the triangular signal described above, and represents the signal that may be generated by driver cell 210. The current source is shown connected to signal lead 520 of leads network 240.

Four signal leads 520, 530, 540 and 550 (corresponding to the four leads shown in FIG. 2) are contained in leads network 240. Signal lead 520 is connected to current source 510 on one end and to all the three signal leads 530, 540 and 550 at the other end. Each signal lead is modeled by resistor-capacitor combination. The values of resistors and capacitors are generally based on the physical dimension and conducting characteristics of the metal used to design signal leads.

Signal lead 520 is modeled as a combination of two resistors (R1 521 and R2 522) and two capacitors (C1 525 and C2 526). Signal lead 530 is modeled as combination of four resistors (R3 531; R4 532; R5 533; R6 534) and four capacitors (C3 535, C4 536, C5 537, and C6 538). Signal lead 540 is modeled as combination of two resistors (R7 541, R8 542) and one capacitor (C7 545). Signal lead 550 is modeled as a combination of two resistors (R9 551, R10 552) and two capacitors (C8 555, C9 556).

Generally, load cells are modeled as capacitors and thus the three load cells of FIG. 2 are shown respectively modeled as capacitors—CL1 560-A through CL3 560-Z. The triangle signal generated by current source 510 is carried by signal lead 520 and distributed to each of the signal leads 530, 540 and 550 based on the respective impedances of capacitors 560-A through 560-Z (representing load cells). The current density parameters on each of the signal leads 530, 540 and 550 can be measured by examining the signals levels on/through the corresponding internal components. Accordingly, the current density parameters of the signal leads can be estimated.

It may be appreciated that the resource requirements for estimating the current density parameter may be reduced (in relation to the approach described in the background section above) as the driver cell is modeled as a single component. The requirements are further reduced since the number of data points required to represent the triangle signal is low.

However, alternative embodiments can be implemented similar to above, using a trapezoid (shaped) signal instead of a triangular shape signal. However, for accuracy of estimation, one of the parallel sides needs to be substantially shorter compared to the other parallel side. When the shorter parallel side equals a single point, the trapezoid equals a triangle.

In addition, as the triangle signal may accurately represent the signal generated by the driver cells, the estimated values may closely resemble the actual parameters that would be encountered during normal operation of the integrated circuit. Thus, various aspects of the present invention enable the current density parameters on signal leads to be estimated potentially accurately, quickly and while consuming fewer resources.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of estimating a plurality of current density parameters characterizing electrical signals that would be transferred on a signal lead of an integrated circuit, said signal lead connecting a driver cell to a load cell, said method being performed in a computer aided design (CAD) tool used to design said integrated circuit, said method comprising:

modeling said driver cell in the form of a triangle signal and said signal lead in the form of an impedance network;

simulating an operation of said integrated circuit by providing said triangle signal as an input to said impedance network; and measuring electrical signals on said impedance network to estimate said plurality of current density parameters on said signal lead;

receiving a first plurality of parameters characterizing operation of said driver cell;

computing a second plurality of parameters characterizing said triangle signal based on said first plurality of parameters; and wherein said triangle signal contains a positive peak and a negative peak, said first plurality of parameters comprises an average current (Javg), a root mean square current (Jrms), a positive peak level (Jpkp), and a negative peak level (Jpkn), wherein durations of a positive portion of said triangle (Ta) and a negative portion of said triangle (Tb) are computed according to the equations:

$$Ta=[\{6T\,Jrms^2+(8T\,Javg\,Jpkn)\}/\{Jpkp\,(Jpkp+2Jpkn)\}];$$

and $$Tb=[2\{6T\,Jrms^2-(4T\,Javg\,Jpkp)\}/\{Jpkn(Jpkp+2Jpkn)\}];$$

wherein T represents periodicity.

2. The method of claim 1, wherein said impedance network comprises at least one resistor and at least one capacitor.

3. A machine readable medium carrying one or more sequences of instructions for causing a system to estimate a plurality of current density parameters characterizing electrical signals that would be transferred on a signal lead of an integrated circuit, said signal lead connecting a driver cell to a load cell, wherein execution of said one or more sequences of instructions by one or more processors contained in said system causes said one or more processors to perform the actions of:

modeling said driver cell in the form of a triangle signal and said signal lead in the form of an impedance network,;

simulating an operation of said integrated circuit by providing said triangle signal as an input to said impedance network;

measuring electrical signals on said impedance network to estimate said plurality of current density parameters on said signal lead;

receiving a first plurality of parameters characterizing operation of said driver cell;

computing a second plurality of parameters characterizing said triangle signal based on said first plurality of parameters; and wherein said triangle signal contains a positive peak and a negative peak, said first plurality of parameters comprises an average current (Javg), a root mean square current (Jrms) a positive peak level (Jpkp), and a negative peak level (Jpkn), wherein durations of a positive portion of said triangle (Ta) and a negative portion of said triangle (Tb) are computed according to the equations:

$$Ta=[\{6T\,Jrms^{2+(}8T\,Javg\,Jpkn)\}/\{Jpkp(Jpkp+2Jpkn)\}];$$

and $$Tb=[2\{6T\,Jrms^2-(4T\,Javg\,Jpkp)\}/\{Jpkn(Jpkp+2Jpkn)\}];$$

wherein T represents periodicity.

4. The machine readable medium of claim 3, wherein said impedance network comprises at least one resistor and at least one capacitor.

5. An apparatus for estimating a plurality of current density parameters characterizing electrical signals that would be transferred on a signal lead of an integrated circuit, said signal lead connecting a driver cell to a load cell, said apparatus comprising:

means for modeling said driver cell in the form of a triangle signal and said signal lead in the form of an impedance network;

means for simulating an operation of said integrated circuit by providing said triangle signal as an input to said impedance network;

means for measuring electrical signals on said impedance network to estimate said plurality of current density parameters on said signal lead;

wherein said means for modeling receives a first plurality of parameters characterizing operation of said driver cell, and computes a second plurality of parameters characterizing said triangle signal based on said first plurality of parameters; and wherein said triangle signal contains a positive peak and a negative peak, said first plurality of parameters comprises an average current (Javg), a root mean square current (Jrms), a positive peak level (Jpkp), and a negative peak level (Jpkn), wherein durations of a positive portion of said triangle (Ta) and a negative portion of said triangle (Tb) are computed according to the equations:

$$Ta=[\{6T\,Jrms^2+(8T\,Javg\,Jpkn)\}/\{Jpkp(Jpkp+2Jpkn)\}];$$

and $$Tb=[2\,\{6T\,Jrms^2-(4T\,Javg\,Jpkp)\}/\{Jpkn(Jpkp+2Jpkn)\}];$$

wherein T represents periodicity.

6. The apparatus of claim 5, wherein said impedance network comprises at least one resistor and at least one capacitor.

* * * * *